(12) United States Patent
Curtis

(10) Patent No.: US 7,515,413 B1
(45) Date of Patent: Apr. 7, 2009

(54) FAN FIELD REPLACEABLE UNIT

(75) Inventor: George Curtis, San Jose, CA (US)

(73) Assignee: Cisco Technology, Inc., San Jose, CA (US)

( * ) Notice: Subject to any disclaimer, the term of this patent is extended or adjusted under 35 U.S.C. 154(b) by 19 days.

(21) Appl. No.: 11/796,339

(22) Filed: Apr. 27, 2007

(51) Int. Cl.
H05K 7/20 (2006.01)

(52) U.S. Cl. .................. 361/695; 361/690; 415/213.1; 165/104.33

(58) Field of Classification Search ............ None
See application file for complete search history.

(56) References Cited

U.S. PATENT DOCUMENTS

| | | | |
|---|---|---|---|
| 5,562,410 A * | 10/1996 | Sachs et al. ............. 415/213.1 |
| 6,611,427 B1 * | 8/2003 | Liao ......................... 361/695 |
| 6,616,525 B1 | 9/2003 | Giraldo et al. |
| 6,625,019 B1 * | 9/2003 | Steinman et al. ........... 361/695 |
| 6,646,877 B2 * | 11/2003 | Willers et al. .............. 361/695 |
| 6,663,416 B2 * | 12/2003 | Huang et al. ............... 439/485 |
| 6,690,576 B2 * | 2/2004 | Clements et al. ........... 361/695 |
| 6,700,779 B2 | 3/2004 | Hanson et al. |
| 6,768,640 B2 | 7/2004 | Doblar et al. |
| 6,795,314 B1 * | 9/2004 | Arbogast et al. ........... 361/695 |
| 6,808,411 B2 * | 10/2004 | Chen ......................... 439/485 |
| 6,865,078 B1 * | 3/2005 | Chang ....................... 361/695 |
| 6,896,611 B2 | 5/2005 | Giraldo et al. |
| 7,009,841 B2 * | 3/2006 | Chen et al. ................. 361/695 |
| 7,021,895 B2 * | 4/2006 | Rubenstein et al. ......... 415/207 |
| 7,033,206 B2 * | 4/2006 | Chang et al. ............... 439/485 |
| 7,054,155 B1 * | 5/2006 | Mease et al. ............... 361/695 |
| 7,173,822 B2 | 2/2007 | Liang et al. |
| 7,239,528 B1 | 7/2007 | McLeod |
| 7,251,135 B2 * | 7/2007 | Crippen et al. ............. 361/695 |
| 7,253,743 B2 | 8/2007 | Liang et al. |
| 7,262,962 B1 | 8/2007 | McLeod et al. |

* cited by examiner

Primary Examiner—Boris L Chervinsky
(74) Attorney, Agent, or Firm—BainwoodHuang

(57) ABSTRACT

A fan device includes a connector, a fan, and an attachment assembly. The fan is configured to provide cooling to circuitry when the fan receives a power signal through the connector. The attachment assembly is configured to control attachment of the fan device to a chassis within an air duct defined by the chassis. The fan defines (i) a near side which faces the circuitry, (ii) a far side which faces away from the circuitry, (iii) an airflow axis which extends from the near side to the far side along an airflow direction, and (iv) a fan profile which is substantially perpendicular to the airflow axis. The fan is disposed substantially between the electronic circuitry and the attachment assembly when the fan device attaches to the chassis within the air duct. The attachment assembly has a width which closely mirrors that of the fan profile.

24 Claims, 8 Drawing Sheets

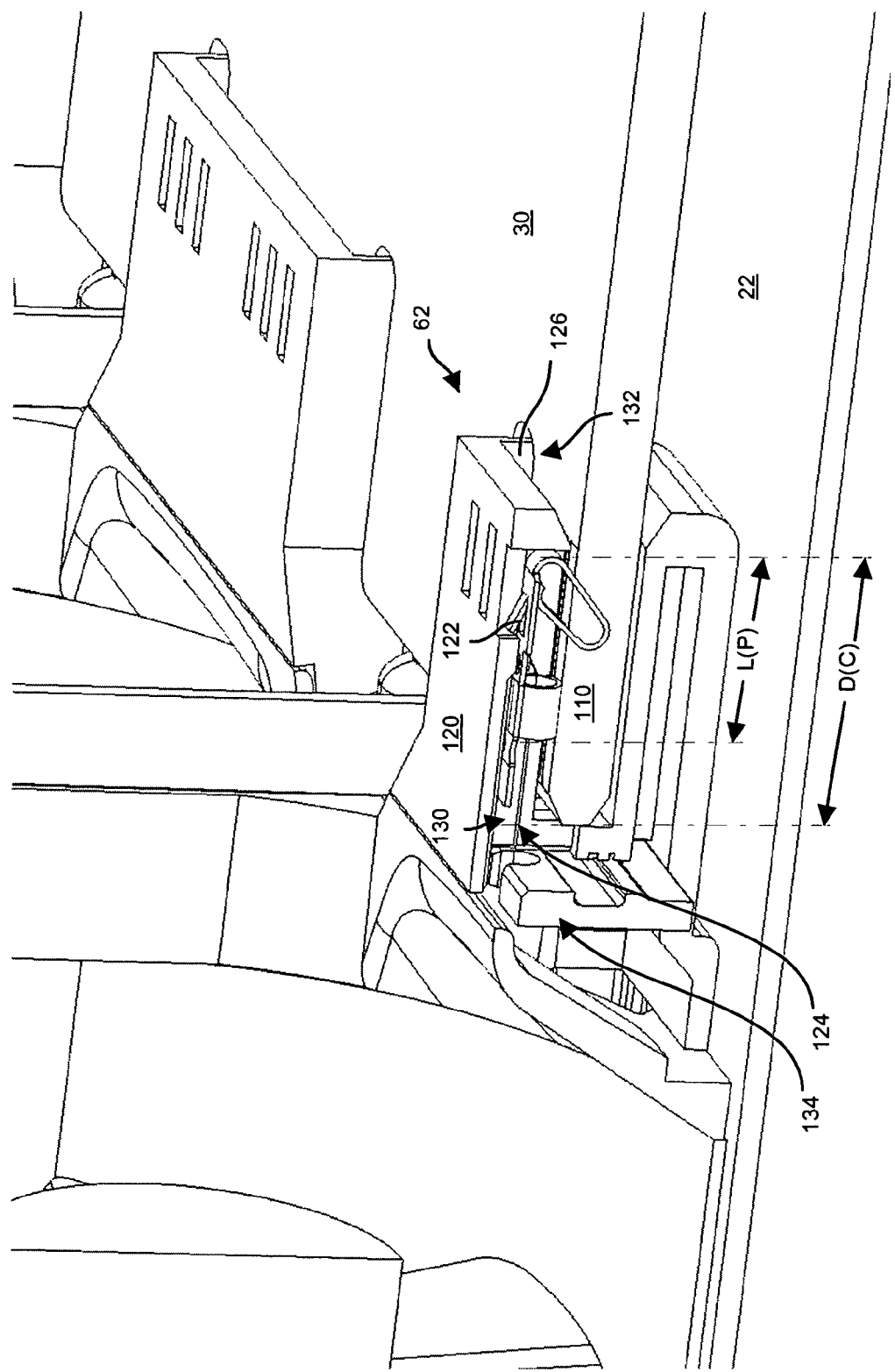

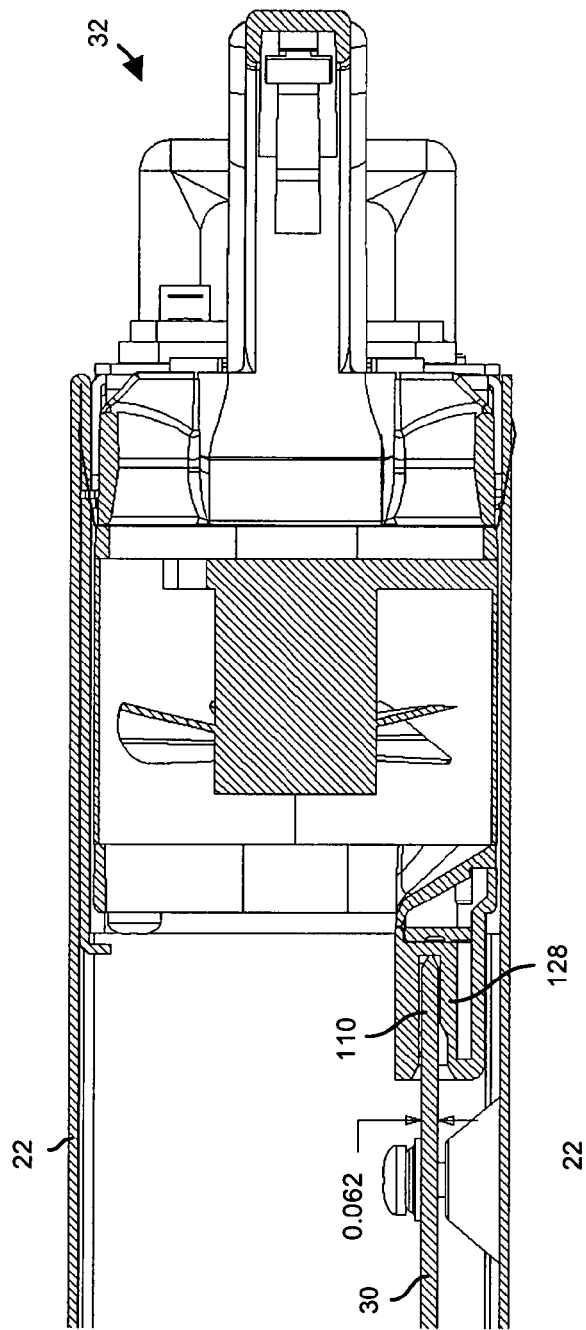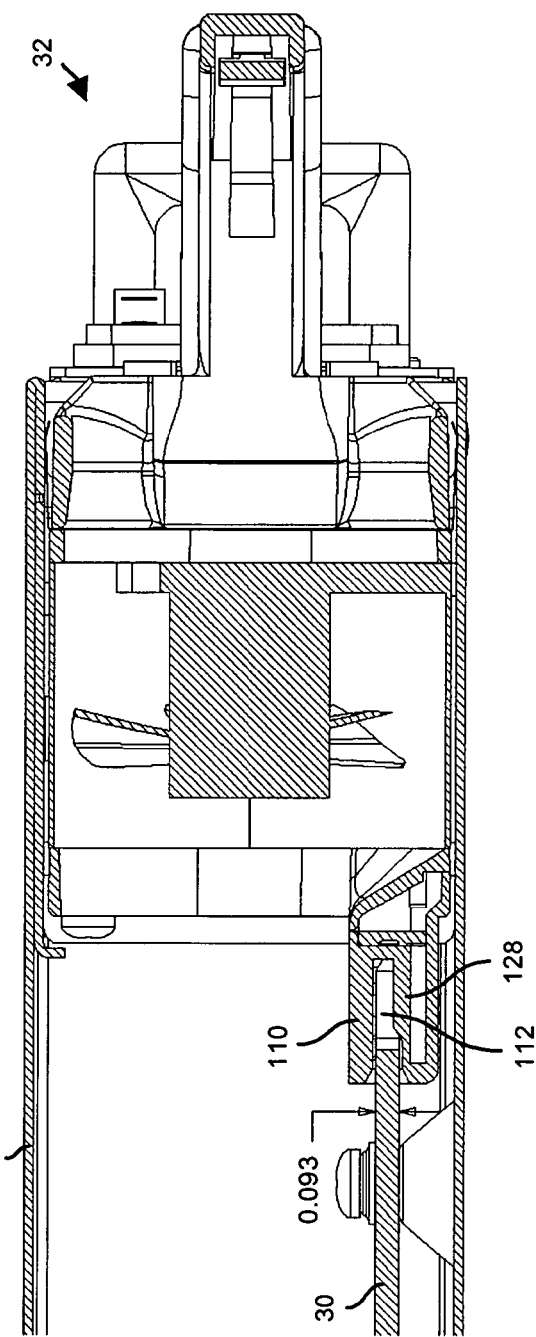

FAN FIELD REPLACEABLE UNIT

BACKGROUND

There are a variety of rack mount enclosures currently available which draw external ambient air from the front of the enclosure, pass the air through the enclosure and exhaust the air through the rear of the enclosure. As the moving air passes by operating circuits within the enclosure, the air carries away heat from the operating circuits thus maintaining the operating circuits within a normal operating temperature range for proper operation and reliability.

One conventional rack mount enclosure is 1 U (approximately 1.75 inches) in height and includes a fan assembly configured as a field replaceable unit (FRU). The fan assembly includes a fan frame and a row of four fans fastened to the fan frame. The fan frame includes a vertical face plate which faces outwardly from the front of the enclosure and two thumbscrews secured to the vertical face plate. The vertical face plate and the thumbscrews are offset from the profiles of the four fans in order to avoid obstructing the airflow generated by the fans. The thumbscrews thread into thumbscrew holes defined by the enclosure thus holding the frame to the enclosure to prevent the fan assembly from inadvertently escaping (e.g., due to vibration).

Suppose that an installed fan assembly suffers a fan failure while out in the field. To replace the installed fan assembly with a new fan assembly, a field technician unscrews the thumbscrews from the enclosure and pulls the installed fan assembly out of the enclosure. The field technician then slides the new fan assembly into the enclosure and screws the thumbscrews of the new fan assembly into the enclosure. If such fan assembly replacement occurs within a short amount of time (e.g., 30 seconds), the temperature of the operating circuits within the enclosure will remain within the normal operating temperature range thus alleviating the need to turn off the operating circuits to prevent overheating during fan assembly replacement.

BRIEF DESCRIPTION OF THE DRAWINGS

The foregoing and other objects, features and advantages will be apparent from the following description of particular embodiments of the invention, as illustrated in the accompanying drawings in which like reference characters refer to the same parts throughout the different views. The drawings are not necessarily to scale, emphasis instead being placed upon illustrating the principles of various embodiments of the invention.

FIG. 6 is a cut-away view of a portion of the electronic system of FIG. 1 to illustrate certain features.

FIG. 7 is a cross-sectional view of the electrical connector of the field replaceable fan device of FIG. 2 when the electrical connector connects with an edge of a circuit board having a first thickness.

FIG. 8 is a cross-sectional view of the electrical connector of the field replaceable fan device of FIG. 2 when the electrical connector connects with an edge of another circuit board having a second thickness.

DETAILED DESCRIPTION

Overview

Figure 1:
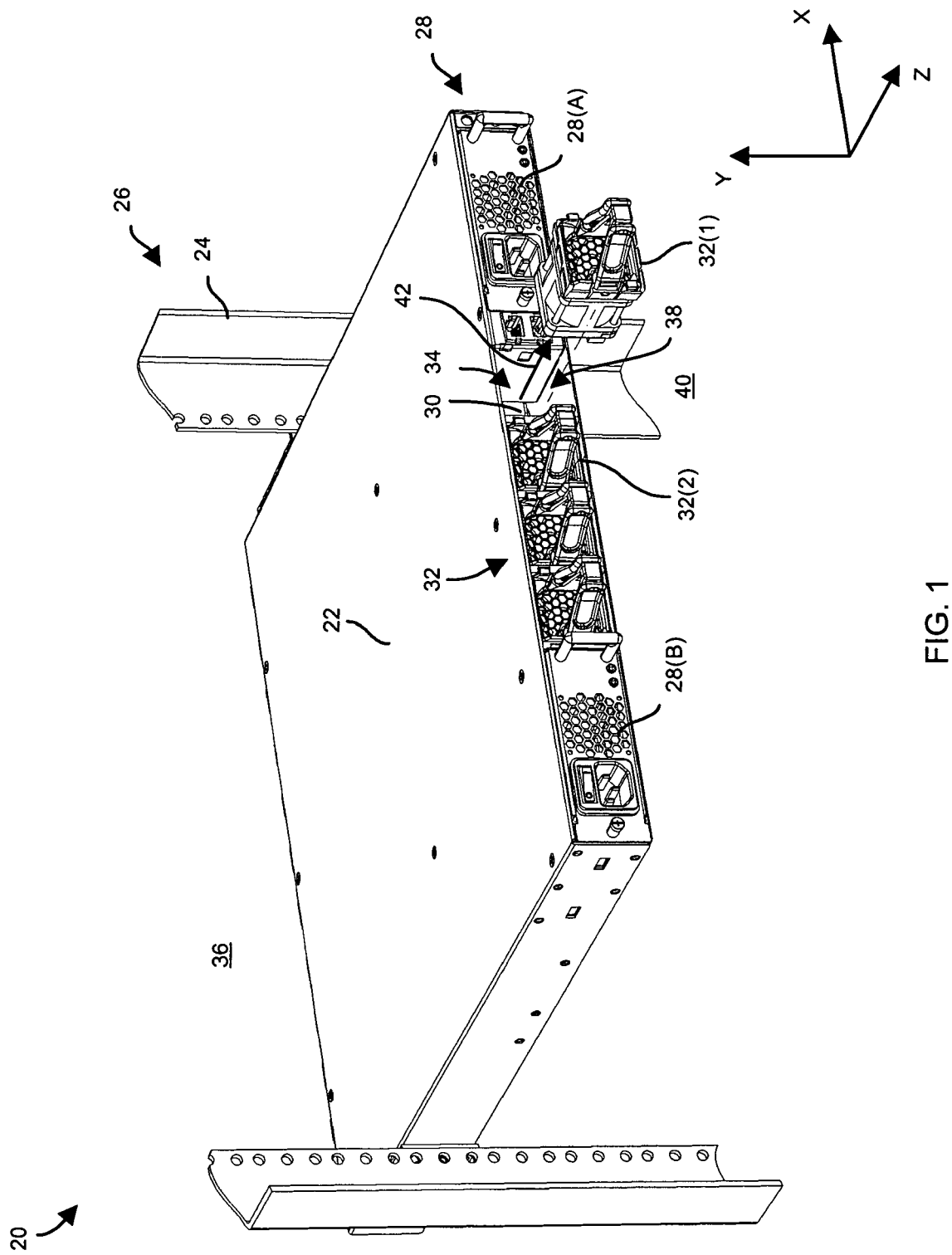
FIG. 1 is a perspective view of an electronic system having multiple field replaceable fan devices.

Unfortunately, there are deficiencies with the above-described conventional 1U rack mount enclosure which uses a fan assembly FRU having a fan frame and a row of four fastened fans. For example, the offset vertical face plate of the fan frame obstructs a significant amount of front opening area that could otherwise be used for additional air exhaust out of the enclosure. As a result, the conventional fan assembly FRU uses fans with larger capacity (to move more air) than would otherwise be needed if the front opening were larger. The use of such larger capacity fans imposes several other related burdens as well (e.g., the need for larger fan motors for more powerful air movement, larger power consumption and thus the potential need for larger power supplies, and so on).

Furthermore, the frame configuration of the above-described conventional fan assembly FRU requires that all four of the fans be replaced at the same time since all of the fans are fastened to the fan frame. Accordingly, even if only one fan fails, the entire fan assembly FRU must be replaced which is wasteful. Moreover, the field technician has the burden of carrying out the replacement in a very short amount of time (e.g., 30 seconds) or risks causing an emergency system shutdown due to overheating of the operating circuits within the enclosure while all of the fans are removed.

In contrast to the above-described conventional 1U rack mount enclosure which uses a fan assembly FRU having an obstructing vertical face plate and a row of four fans, embodiments of the invention involve the use of a field replaceable fan device having a fan and an attachment assembly which is disposed in front of the fan, but in a non-obstructing manner that does not block the fan. That is, the fan sits between the electronic circuitry being cooled and the attachment assembly which controls attachment of the fan device so that the attachment assembly resides within the profile of the fan, i.e., the attachment assembly has a width which is at most equal to a width of the fan profile. Accordingly, multiple fans are capable of being installed individually, and are further capable of being replaced individually without interfering with the operation of the other fans or the electronic circuitry.

One embodiment is directed to a fan device which includes a connector, a fan, and an attachment assembly. The fan is configured to provide cooling to electronic circuitry when the fan receives a power signal through the connector. The attachment assembly is configured to control attachment of the fan device to a chassis within an air duct defined by the chassis. The fan defines (i) a near side which faces the electronic circuitry, (ii) a far side which faces away from the electronic circuitry, (iii) an airflow axis which extends from the near side to the far side along an airflow direction, and (iv) a fan profile which is substantially perpendicular to the airflow axis. The fan is disposed substantially between the electronic circuitry and the attachment assembly when the fan device attaches to the chassis within the air duct. The attachment assembly has a width which closely mirrors that of the fan profile.

Description of Example Embodiments

FIG. 1 shows an electronic system 20 having multiple field replaceable fan devices. It should be understood that the electronic system 20 is described below in the context of rack mount equipment by way of example only and that the electronic system 20 is capable of being implemented in other ways, e.g., in stand alone configurations, in custom frames with other electronic components, in half or full height electronic cabinets, and so on.

As shown in FIG. 1, the electronic system 20 includes a chassis 22 which mounts to vertical rails 24 of an electronic equipment rack 26. The electronic system 20 further includes a set of power sources 28(A), 28(B) (collectively, power sources 28), i.e., one or more power supplies or power converters/conditioners. The electronic system 20 further includes electronic circuitry 30, and multiple field replaceable fan devices 32(1), 32(2), ... (collectively, fan devices 32) which are constructed and arranged as single fan FRUs which reside within respective ducts 34 defined by the chassis 22. In particular, each fan device 32 is constructed and arranged to mechanically lock into the chassis 22 and electrically connect with the electronic circuitry 30 in a blind mating manner.

During operation, both the electronic circuitry 30 and the fan devices 32 preferably draw power from the power sources 28. The electronic circuitry 30 performs electronic operations (e.g., data communications operations, data processing operations, etc.) and the fan devices 32 provide cooling to the electronic circuitry 30. By way of example, the fan devices 32 (i) draw external ambient air from a front 36 of the electronic equipment rack 26 through a central core 38 of the chassis 22, and (ii) exhaust the air out to a back 40 of the electronic equipment rack 26 for robust and reliable removal of heat from the electronic circuitry 30 (illustrated by the arrow 42 which is substantially parallel to the Z-axis in FIG. 1).

As will be explained in further detail shortly, a user is capable of removing each fan device 32 individually by actuating a portion of the front of the fan device 32. With removal of only one fan device 32 at a time, the user is capable of replacing any fan device 32 which fails while allowing the other fan devices 32 to remain installed and in operation. As a result, replacement of a failed fan device 32 is less expensive than replacing a conventional four fan assembly, and is capable of being performed without risk of overheating the electronic circuitry 30 since the remaining fan devices 32 can continue to provide cooling during replacement of the failed fan device 32.

Moreover, since there is no obstructing vertical face plate as in conventional fan assemblies, the profiles of the fan devices 32 (i.e., the geometry of the fan devices in the X-Y plane of FIG. 1) can be made larger that would otherwise be possible if obstructing vertical face plates were implemented. As a result, the motors of the fan devices 32 can be smaller due to lower air rate demands, and thus the power source 28 can be made smaller as well. Further details will now be provided with reference to FIG. 2.

Figure 2:
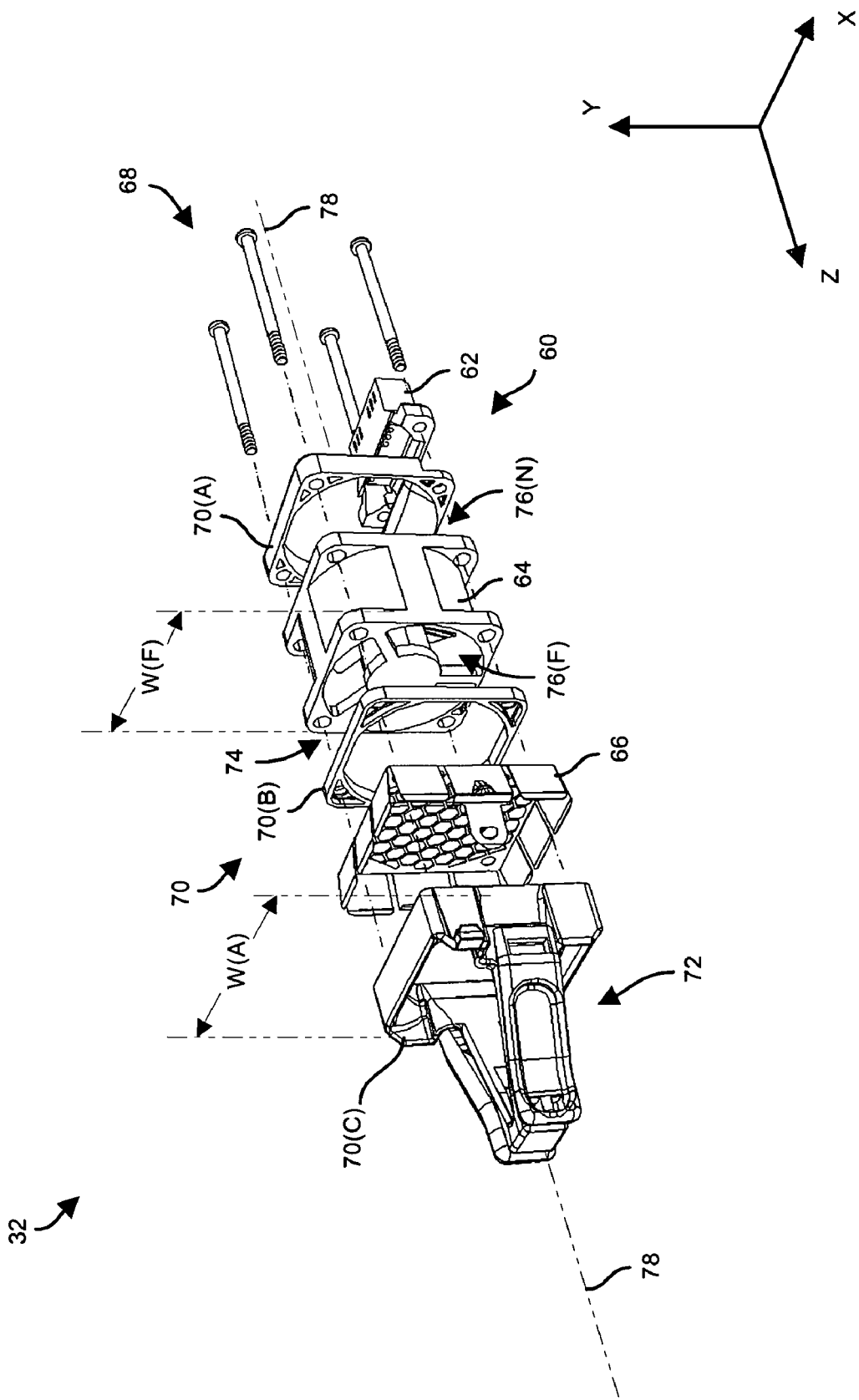
FIG. 2 is an exploded view of a field replaceable fan device of FIG. 1.

FIG. 2 is an exploded view of a fan device 32 of the electronic system 20. As shown, the fan device 32 includes a base 60, an electrical connector 62, a fan 64, an electromagnetic interference (EMI) shield 66, and hardware 68 which holds these various components together. The base 60 includes frame body portions 70(A), 70(B) and 70(C) (collectively, base portions 70) which operate to properly position the other components in fixed positions with specific displacements/offsets relative to each other along the Z-axis.

The electrical connector 62 is constructed and arranged to mechanically connect with the electronic circuitry 30 and electrically connect to the power sources 28 through the electronic circuitry 30 to obtain a power signal (also see FIG. 1). The fan 64 is constructed and arranged to provide cooling to the electronic circuitry 30 when the fan 64 receives the power signal through the electrical connector 62. The EMI shield 66 forms an EMI gasket in the X-Y plane over a respective duct 34 of the chassis 22 (FIG. 1) to prevent EMI from escaping and/or entering through that duct 34.

The base portion 70(C) includes an attachment assembly 72 which is constructed and arranged to control attachment of the fan device 32 to the chassis 22. As will be described in further detail shortly, the attachment assembly 72 is configured to actuate parts of the EMI shield 66 which control latching of the fan device 32 to the chassis 32 and unlatching of the fan device 32 from the chassis 32.

It should be understood that the fan 64 has a face or fan profile 74 which essentially determines the necessary size of the fan device 32, i.e., the outer dimensions of the fan 64 in the X-Y plane. Both the EMI shield 66 and the attachment assembly 72 reside substantially in front of this fan profile 74 but nevertheless possess geometries to allow robust air flow (see FIG. 2). Along these lines, the fan 64 has a near side 76(N) which faces the electronic circuitry 30 and a far side 76(F) which faces away from the electronic circuitry 30 when the fan device 32 is installed within a chassis duct 34 (FIG. 1). As such, when the fan 64 rotates, the fan 64 generates air flow along an axis 78 which is substantially parallel to the Z-axis, and substantially perpendicular to the fan profile 74 in the X-Y plane.

The attachment assembly 72 has a width W(A) which closely mirrors a width W(F) of the fan profile 74. In some arrangements, the attachment assembly width W(A) exceeds the fan profile width W(F) by only a few mils (e.g., 0.010 inches or less) thus minimizing consumption of area in the X-Y which is now available for air flow. That is, due to the geometry of the attachment assembly 72, the attachment assembly 72 sits directly in front of the fan 64 (i.e., within the fan profile 74) thus enabling the fan device 32 to efficiently utilize the amount of available opening to the chassis core 38. In contrast to conventional devices which require a face plate and thumbscrew to fasten a fan assembly to an enclosure, the attachment assembly 72 does not need any face plate or any thumbscrew that could otherwise obstruct air flow or otherwise reduce the size of the chassis openings for sub-optimal air flow. Further details will now be provided with reference to FIG. 3.

Figure 3:
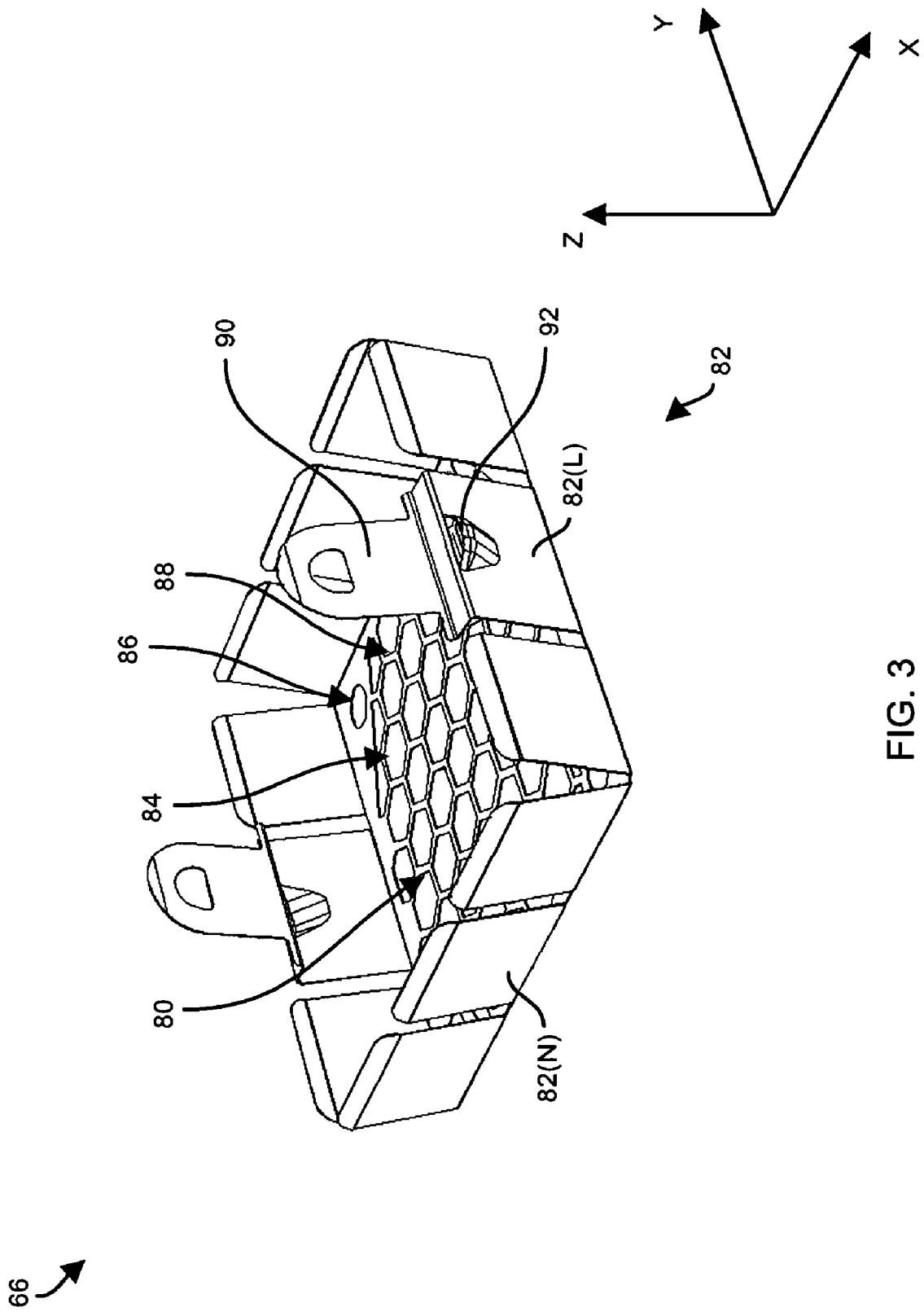
FIG. 3 is a perspective view of an electromagnetic shield of the field replaceable fan device of FIG. 2.

FIG. 3 is a perspective view of the EMI shield 66 of a fan device 32 of the electronic system 20. The EMI shield 66 includes a metallic central screen portion 80 and metallic tab portions 82(L), 82(N) (collectively, tabs 82) which couple to the screen portion 80 around its periphery. The central screen portion 80 mirrors the fan profile 74 of the fan 64 and defines air flow apertures 84 which permit robust and reliable air flow, as well as hardware apertures 86 which allow the hardware 68 (e.g., screws) to pass therethrough and thus fasten together the various components of the fan device 32 (also see FIG. 1). Both the central screen portion 80 and the tabs 82 block EMI thus forming an effective EMI seal at the chassis ducts 34 (FIG. 1). Along these lines, the tabs 82 are configured to compress towards each other when the fan device 32 inserts into a chassis duct 34 and continuously provide spring force against the duct walls for reliable EMI sealing.

In some arrangements, the EMI shield 66 is formed from a single section of thin sheet metal which is cut and folded into the form illustrated in FIG. 3, i.e., into a unitary body with integral portions 80, 82. Such arrangements are capable of utilizing advantageously thin metal stock (e.g., 0.1 mm thick sheet metal) which is stamped/pressed thus enabling formation of very thin connecting segments 88 between the apertures 84. With these thin connecting segments 88, the apertures 84 can be made relatively large with optimal shapes (e.g., hexagonal holes) for minimal air resistance while enabling the central screen portion 80 to still provide reliable EMI shielding and structural soundness.

As further shown in FIG. 3, each peripheral tab portion 82(L) defines an actuation section 90 and a catch 92. As will be described shortly, the catches 92 of the tab portions 82(L) are constructed and arranged to engage the duct walls of the chassis 34 when the fan device 32 inserts into a chassis duct 34 (FIG. 1). Further details of the latching/de-latching features of the fan device 32 will now be provided with reference to FIGS. 3 and 4.

Figure 4:
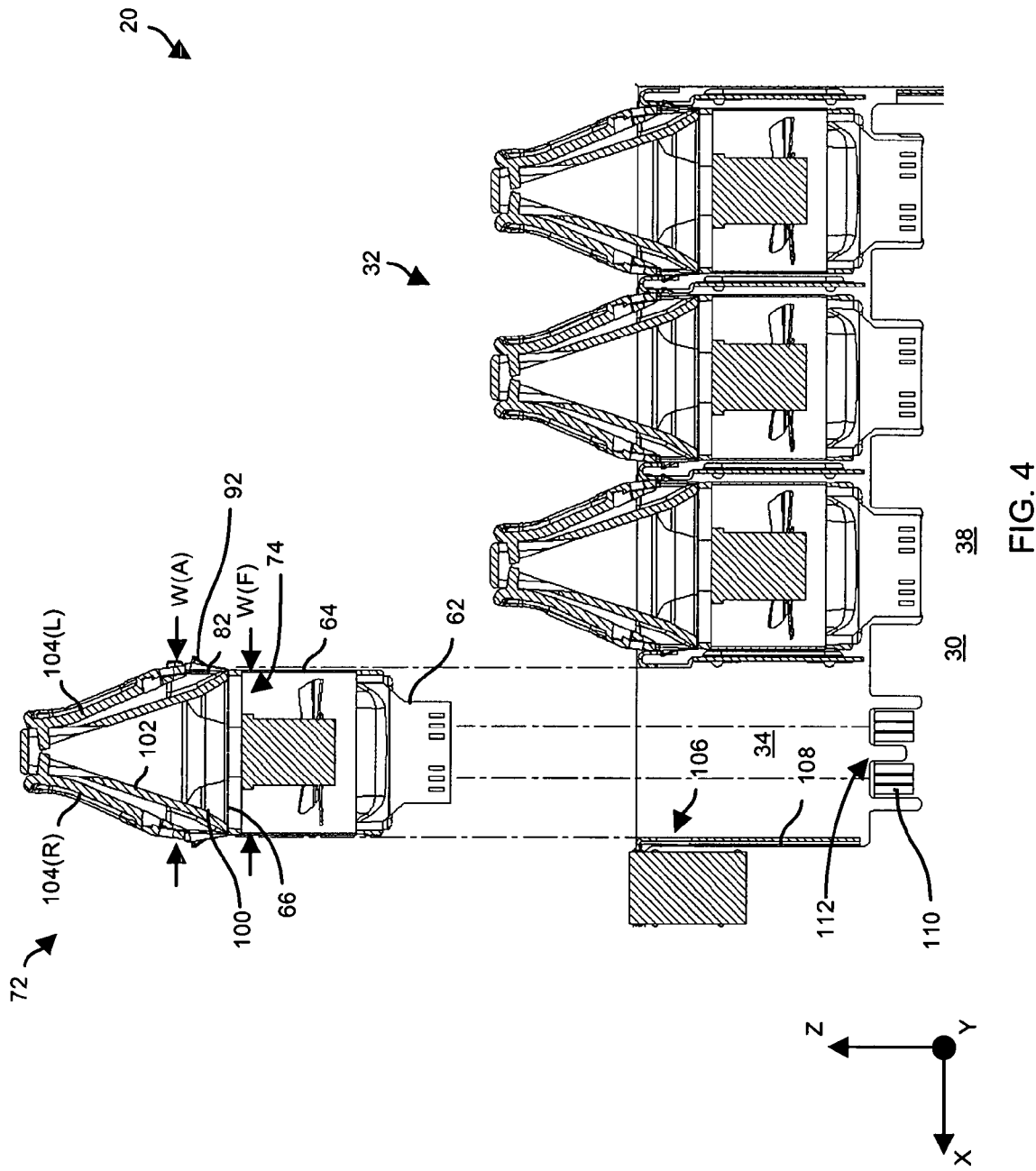
FIG. 4 is a cross-sectional top view of the electronic system of FIG. 1 showing a field replaceable fan device in a locked state within a chassis duct.

FIG. 4 is a cross-sectional top view of the electronic system 20 (FIG. 1) showing multiple field replaceable fan devices 32 in installed positions within respective ducts 34 of the chassis 22 and one field replaceable fan device 32 (i.e., the leftmost fan device 32 in FIG. 4) in a removed position relative to the chassis 22. As shown, the facial geometry of the actuation assembly 72 of each fan device 32 closely matches that of the fan profile 74, e.g., the actuation assembly width W(A) is only slightly larger than the fan width W(F), thus optimizing air flow capacity for the chassis 22.

With attention now drawn to the removed fan device 32 of FIG. 4, each actuation assembly 72 includes a frame body 100, a lever guide 102, and a pair of levers 104(R), 104(L) (collectively levers 104). The frame body 100, which mirrors the periphery of the fan profile 74, is configured to hold the EMI shield 66 in a fixed position relative to the fan 64. The lever guide 102 extends from one side of the frame body 100 to the other side of the frame body 100 across the fan profile 74. The levers 104(R), 104(L) loosely couple to the lever guide 102 (e.g., by way of tabs of the levers 104 riding in slots of the lever guide 102) and control movement of the tab portions 82(L) of the EMI shield 66 (also see FIG. 3). In particular, the ends of the levers 104 actuate the actuation sections 90 of the EMI shield 66 to control positioning of the catches 92 (also see FIG. 3).

As illustrated in FIG. 4, the fan devices 32 install into and de-install from respective ducts 34 of the chassis 22 along the Z-axis. To install a fan device 32 into a duct 34 of the chassis 22, a user simply aligns the fan device 32 with the duct 34 and then inserts the fan device 32 into the duct 34 in the negative Z-direction. As the fan device 32 moves into the duct 34, the tabs 82 of the EMI shield 66 (FIG. 3) eventually make electrical contact with the duct walls 108 and compress slightly towards each other to provide robust EMI gasketing. Furthermore, the catches 92 of the tab portions 82(L) engage notches 106 within the duct walls 108 thus preventing the fan device 32 from inadvertently escaping the chassis 22 (e.g., due to vibration over time). In particular, the tab portions 82(L) provide outward spring force (i.e., force opposing compression of the tab portions 82(L) towards each other) which maintains the catches 92 in reliable engagement with the duct walls 108 thus locking the fan device 32 within the chassis 22.

It should be understood that, during fan device insertion, the electrical connector 62 of the fan device 32 connects with an edge portion 110 of the electronic circuitry 30 in a blind mating manner. As will be described in further detail shortly, the edge portion 110 may define a slot 112 if the electronic circuitry 30 is implemented as a circuit board with a particular thickness.

To remove a fan device 32 from a duct 34, the user simply actuates the levers 104 of the actuation assembly 72. In particular, the user applies actuation force to the levers by squeezing the levers 104(R), 104(L) toward each other thus overcoming the spring forces of the tab portions 82(L) and deflecting the tab portions 82(L) toward each other and away from the duct walls 110. The narrowing shape and curvature of the lever guide 102 provides interference against the levers 104 to prevent over-travel of the levers 104 and thus prevent damage to either the levers 104 or the EMI shield 66. In response to disengagement of the catches 92 from the duct walls 110, the fan device is no longer locked onto the chassis 22 and user is able to freely extract the fan device 32 by moving the fan device 32 out of the duct 34 in the positive Z-direction. Further details will now be provided with reference to FIGS. 5 and 6.

Figure 5:
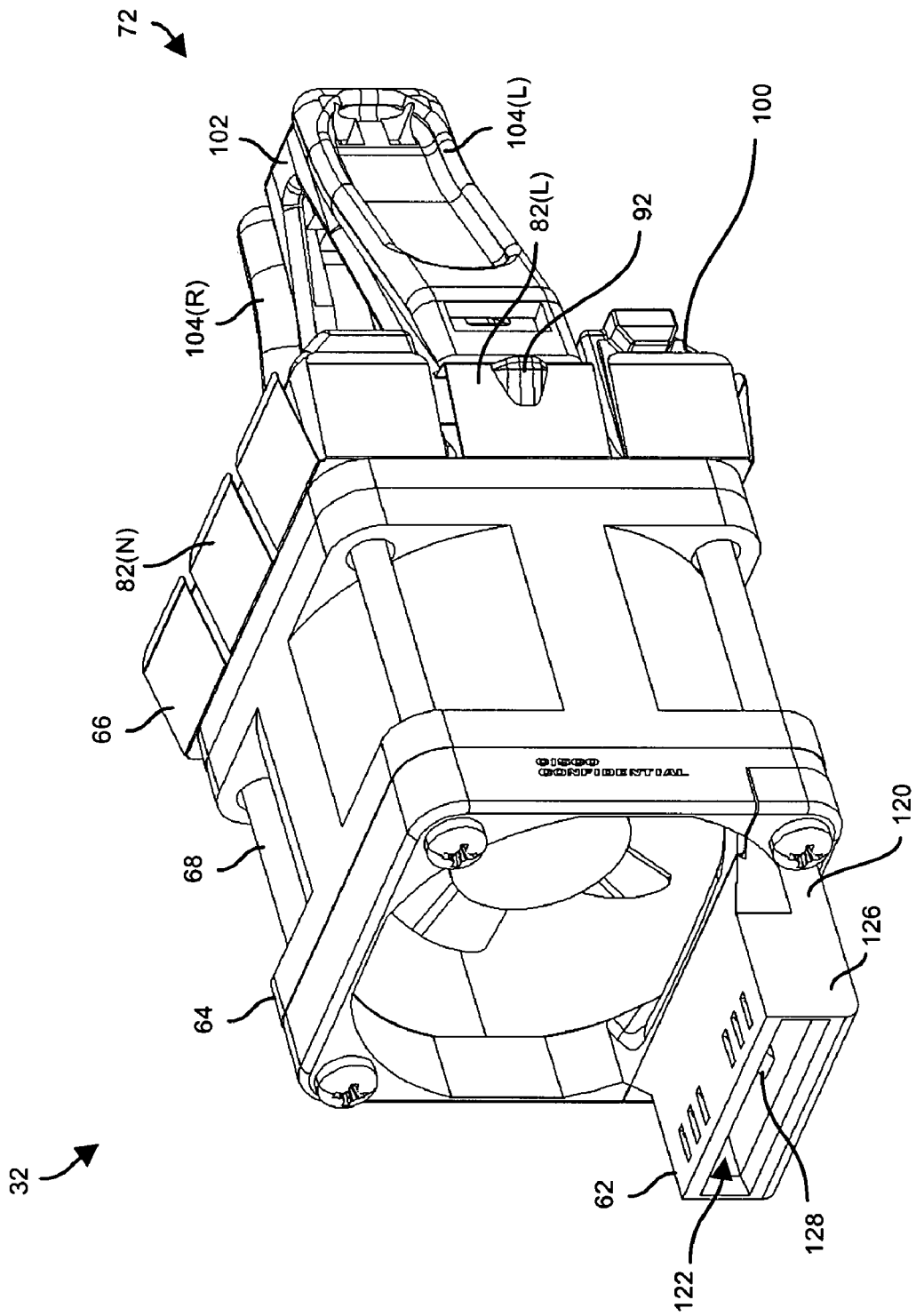
FIG. 5 is a perspective view of the fan device of FIG. 2 but in an assembled form and from a reverse angle.

FIG. 5 is a perspective view of the fan device 32 in an assembled form. FIG. 6 is a cut-away view of the electrical connector 62 of the fan device 32 as the fan device 32 connects to a circuit board edge portion 110 of the electronic circuitry 30. As shown, the electrical connector 62 includes a connector body 120 and a set of metallic contacts 122. The connector body 120 defines a set of recesses 124, connector walls 126 and a ramp 128 (FIG. 5). The inner chamber of the connector 62 is sized not only to define the set of recesses 124 for holding the set of contacts 122, but also to provide added depth D(C) to support and protect wire end portions 130 which mate with the contacts 122. In some arrangements, the contacts 122 fasten to the wire end portions 130 in a crimp-style manner.

As best illustrated in FIG. 6, the connector walls 126 align with circuit board grooves 132 in order to fit around the edge portion 110 of the electronic circuitry 30. The added depth D(C) provided by the electrical connector 62 enables extremely deep contact wipe for competent and reliable electrical contact that would not be achievable in a conventional approach of simply providing a connector depth commensurate with the length L(P) of the contacts 122. This is accomplished by a wire support beam 134 that holds the wires and crimp terminals up and out of the way of the circuit board. Further details will now be provided with reference to FIGS. 7 and 8.

FIGS. 7 and 8 illustrate the ability of the fan device 32 to reliably connect with plane-shaped circuit boards of different thicknesses. FIG. 7 is a cross-sectional view of the electrical connector 62 of the fan device 32 when the electrical connector 62 connects with an edge of a circuit board having a first thickness, e.g., 0.062 inches (the circuit board forming at least a portion of the electronic circuitry 30). Similarly, FIG. 8 is a cross-sectional view of the electrical connector 62 when the electrical connector 62 connects with an edge of another circuit board having a second thickness, e.g., 0.093 inches.

As shown in FIG. 7, the electrical connector 62 is capable of connecting with a circuit board having a first thickness. Here, the edge portion 110 of the circuit board does not include a slot as shown in FIG. 4. Rather, due to the relative thinness of the circuit board, the edge portion 110 of the circuit board is contiguous and thus makes mechanical contact with the ramp 128 defined by the electrical connector 62 during the mating process. As a result, the ramp 128 applies a predefined amount of connecting force against the edge portion 110 for reliable engagement.

As shown in FIG. 8, the electrical connector 62 is capable of additionally connecting with another circuit board having a second thickness. Here, due to the greater thickness of the circuit board, the edge portion 110 of the circuit board includes a slot 112 (also see FIG. 4) which allows the ramp 128 to substantially clear the circuit board. That is, the ramp 128 substantially misses the edge portion 110 during the mating process. As a result, the walls 126 of the connector body 120 predominantly apply a predefined amount of connecting force against the edge portion 110 for reliable engagement.

It should be understood that, due to the ability of the fan device 32 to connect with circuit boards of different thicknesses, the fan device 32 is capable of connecting to different designed circuit boards. For instance, for circuit boards having less layers, the electrical connector 62 is capable of making competent edge connections (FIG. 7) without the use of a circuit board slot. Furthermore, for circuit boards having more layers and thus greater thickness, the electrical connector 62 is still capable of making competent edge connections (FIG. 8) but with the user of a circuit board slot (see the slot 112 in FIG. 4). Further details will now be provided with reference to FIG. 9.

Figure 9:
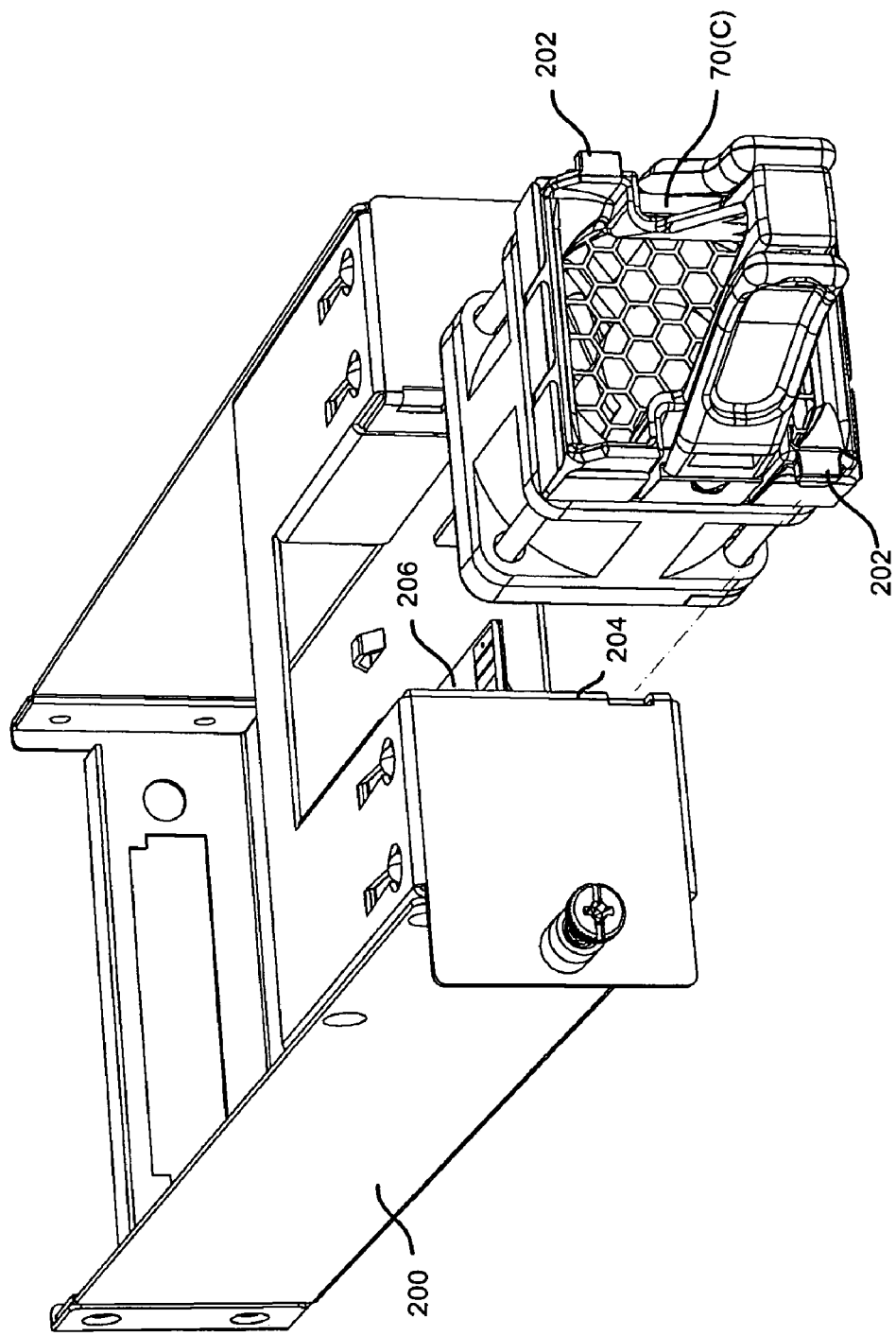
FIG. 9 is a perspective view of the field replaceable fan device in the context of connecting with a power supply module to form a power supply field replaceable unit.

FIG. 9 shows that the fan device 32 is capable of directly connecting to non-system-level equipment. By way of example, the fan device 32 is shown in FIG. 9 as connecting to a component 200 such as a power supply FRU. Here, the frame body 70(C) defines rigid tabs 202 on each side which are constructed and arranged to interlock with a body 204 of the component 200 as the electrical connector 62 engages with circuitry 206 (e.g., a circuit board) of the component 200. With such meshing of the tabs 202 and the component body 204, the fan device 32 is prevented from rocking or pivoting about the circuitry 206 which could otherwise cause poor electrical connectivity or damage.

By way of example, the component 200 is shown in FIG. 9 as having a 1 U form factor thus making the component 200 well-suited for 1 U enclosure applications. For example, the component 200 is capable of being employed in a 1 U rack mount chassis 22 fastened to rails 24 as shown in FIG. 1 where other equipment resides above and below the chassis 22.

Due to the ability of the fan device 32 to connect to circuit boards of various thicknesses, and to non-system-level equipment, the fan device 32 is capable of being used in a variety of applications. Such a fan device 32 enables the manufacturer to re-use the fan device 32 in different applications with little or no re-design.

While various embodiments of the invention have been particularly shown and described, it will be understood by those skilled in the art that various changes in form and details may be made therein without departing from the spirit and scope of the invention as defined by the appended claims.

For example, the fan devices 32 were described above as drawing air through the central core 38 of the chassis 22 and exhausting the air out a back 40 of the chassis 22 (i.e., in the positive Z-direction) by way of example only. In other arrangements, the fan devices 32 blow air into the central core 38 in the opposite direction to provide cooling (i.e., in the negative Z-direction). Such other arrangements may be desirable when the fan devices 32 reside at a front of an enclosure so that the warmed air is exhausted out a rear of the enclosure and generally away from any equipment operators or technicians.

Additionally, it should be understood that the electrical connectors 62 of the fan devices 32 were shown as having contacts 122 on only one side by way of example only. In other arrangements, the electrical connectors 62 have contacts 122 on multiple sides, e.g., upper and lower sides, to provide additional exchange of signals therebetween. Such modifications and enhancements are intended to belong to various embodiments of the invention.

What is claimed is:

1. A fan device which is field replaceable within an electronic system; the electronic system having a chassis, electronic circuitry, and a power source; the fan device comprising:
   an electrical connector constructed and arranged to electrically connect to the power source of the electronic system;
   a fan coupled to the electrical connector, the fan being constructed and arranged to provide cooling to the electronic circuitry of the electronic system when the fan receives a power signal from the power source of the electronic system through the electrical connector; and
   an attachment assembly coupled to the fan, the attachment assembly being constructed and arranged to control attachment of the fan device to the chassis of the electronic system within an air duct defined by the chassis, the fan defining (i) a near side which faces the electronic circuitry, (ii) a far side which faces away from the electronic circuitry, (iii) an airflow axis which extends from the near side to the far side along an airflow direction, and (iv) a fan profile which is substantially perpendicular to the airflow axis, the fan being disposed substantially between the electronic circuitry and the attachment assembly when the fan device attaches to the chassis within the air duct defined by the chassis, the attachment assembly having a width which closely mirrors a width of the fan profile; wherein the attachment assembly includes a frame body which is constructed and arranged to hold an electromagnetic interference shield in a fixed position relative to the fan.

2. A fan device as in claim 1, further comprising:
   an electromagnetic interference barrier adjacent the fan;
   wherein the electromagnetic interference barrier includes a central screen portion which mirrors the fan profile defined by the fan; and
   wherein the central screen portion defines a metallic web that concurrently operates as (i) an electromagnetic interference shield which shields against electromagnetic interference and (ii) an air pathway which permits air to flow therethrough.

3. A fan device as in claim 2 wherein the a frame body is disposed adjacent the central screen portion of the electromagnetic interference barrier, the frame body mirroring the fan profile.

4. A fan device as in claim 3 wherein the electromagnetic interference barrier further includes peripheral tab portions coupled to the central screen portion and being disposed around a periphery of the frame body, the peripheral tab portions being constructed and arranged to provide an electromagnetic interference seal between the central screen portion and the chassis when the fan device attaches to the chassis within the air duct defined by the chassis.

5. A fan device as in claim 4 wherein the central screen portion and the peripheral tab portions of the electromagnetic interference barrier are integrally formed from a single section of sheet metal.

6. A fan device as in claim 4 wherein a first tab portion and a second tab portion form a pair of tab portions of the electromagnetic interference barrier is configured to selectively (i) engage the chassis to lock the fan device into an installed position relative to the electronic circuitry and (ii) disengage the fan device from the chassis to unlock the fan device from installed position, based on orientation of the first and second tab portions relative to the chassis.

7. A fan device as in claim 6 wherein the attachment assembly further includes a first lever and a second lever which form a pair of levers, the pair of levers being constructed and arranged to deflect the pair of tab portions from engaging orientations configured to engage the fan device with the chassis to disengaging orientations configured to disengage the fan device from the chassis in response to user actuation.

8. A fan device as in claim 7 wherein the first and second tab portions are configured to provide spring force away from each other to engage the fan device with the chassis when the fan device resides within the air duct defined by the chassis.

9. A fan device as in claim 8 wherein the first lever and the second lever are constructed and arranged to provide actuation force which moves the first and second tab portions toward each other in response to the user actuation to disengage the fan device from the chassis when the fan device initially resides within the air duct defined by the chassis.

10. A fan device as in claim 7 wherein the attachment assembly further includes a lever guide which extends from a first side of the fan profile to a second side of the fan profile which is opposite the first side, the lever guide being constructed and arranged to provide interference against the first and second levers to prevent over-travel of the first and second levers.

11. A fan device as in claim 3 wherein the power source is a field replaceable power supply module; and wherein the frame body of the attachment assembly defines interlocking tabs constructed and arranged to prevent rocking of the fan device when the fan device directly engages the field replaceable power supply module.

12. A fan device as in claim 1 wherein the electrical circuitry resides on a plane-shaped circuit board; and
wherein the electrical connector is a circuit board edge connector which defines a slot, the electrical connector being constructed and arranged to (i) mechanically receive an edge portion of the plane-shaped circuit board within the slot and (ii) make electrical contact with metallic contacts on at least one side of the plane-shaped circuit board.

13. Fan device as in claim 12 wherein the slot defined by the circuit board edge connector has a predefined slot width; and
wherein the circuit board edge connector further defines a ramp which is constructed and arranged to press against the plane-shaped circuit board when the plane-shaped circuit board has a predefined thickness which is less than the predefined slot width.

14. A fan device as in claim 13 wherein the circuit board edge connector includes a body and multiple crimp-style contacts, each of the crimp-style contact having a contact length, and the body defining a connector depth which is larger than the contact length.

15. A fan device as in claim 1 wherein the airflow axis extends substantially through an axis of rotation of the fan; and wherein the attachment assembly is constructed and arranged to receive actuation in directions substantially perpendicular to the airflow axis and toward the airflow axis.

16. A fan device which is field replaceable within an electronic system; the electronic system having a chassis, electronic circuitry, and a power source; the fan device comprising:
an electrical connector constructed and arranged to electrically connect to the power source of the electronic system;
a fan coupled to the electrical connector, the fan being constructed and arranged to provide cooling to the electronic circuitry of the electronic system when the fan receives a power signal from the power source of the electronic system through the electrical connector; and
control means for controlling attachment of the fan device to the chassis of the electronic system within an air duct defined by the chassis, the fan defining (i) a near side which faces the electronic circuitry, (ii) a far side which faces away from the electronic circuitry, (iii) an airflow axis which extends from the near side to the far side along an airflow direction, and (iv) a fan profile which is substantially perpendicular to the airflow axis, the fan being disposed substantially between the electronic circuitry and the control means when the fan device attaches to the chassis within the air duct defined by the chassis, a width of the control means closely mirroring a width of the fan profile; wherein the control means includes means for holding an electromagnetic interference shield in a fixed position relative to the fan.

17. A fan device as in claim 16, further comprising:
an electromagnetic interference barrier adjacent the fan;
wherein the electromagnetic interference barrier includes a central screen portion which mirrors the fan profile defined by the fan; and
wherein the central screen portion defines a metallic web that concurrently operates as (i) an electromagnetic interference shield which shields against electromagnetic interference and (ii) an air pathway which permits air to flow therethrough.

18. A fan device as in claim 16 wherein the airflow axis extends substantially through an axis of rotation of the fan; and wherein the control means is constructed and arranged to receive actuation in directions substantially perpendicular to the airflow axis and toward the airflow axis.

19. A fan device as in claim 16 wherein the electrical circuitry resides on a plane-shaped circuit board; and
wherein the electrical connector is a circuit board edge connector which defines a slot, the electrical connector including to (i) means for mechanically receiving an edge portion of the plane-shaped circuit board within the slot and (ii) means for making electrical contact with metallic contacts on at least one side of the plane-shaped circuit board.

20. An electronic system, comprising:
a chassis constructed and arrangement to mount to an electronic equipment rack;
a power source disposed within the chassis;
electronic circuitry disposed within the chassis; and
a fan device which is field replaceable, the fan device including:
an electrical connector constructed and arranged to electrically connect to the power source of the electronic system,
a fan coupled to the electrical connector, the fan being constructed and arranged to provide cooling to the electronic circuitry of the electronic system when the fan receives a power signal from the power source of the electronic system through the electrical connector, and
an attachment assembly coupled to the fan, the attachment assembly being constructed and arranged to control attachment of the fan device to the chassis of the electronic system within an air duct defined by the chassis, the fan defining (i) a near side which faces the electronic circuitry, (ii) a far side which faces away from the electronic circuitry, (iii) an airflow axis which extends from the near side to the far side along an airflow direction, and (iv) a fan profile which is substantially perpendicular to the airflow axis, the fan being disposed substantially between the electronic circuitry and the attachment assembly when the fan device attaches to the chassis within the air duct defined by the chassis, the attachment assembly having a width which closely mirrors a width of the fan profile; wherein the attachment assembly includes a frame body which is constructed and arranged to hold an electromagnetic interference shield in a fixed position relative to the fan.

21. An electronic system as in claim 20 wherein the fan device further includes an electromagnetic interference barrier adjacent the fan;

wherein the electromagnetic interference barrier includes a central screen portion which mirrors the fan profile defined by the fan; and wherein the central screen portion defines a metallic web that concurrently operates as (i) an electromagnetic interference shield which shields against electromagnetic interference and (ii) an air pathway which permits air to flow therethrough.

22. An electronic system as in claim 21 wherein the frame body is disposed adjacent the central screen portion of the electromagnetic interference shield, the frame body mirroring the fan profile.

23. An electronic system as in claim 20 wherein the airflow axis extends substantially through an axis of rotation of the fan; and wherein the attachment assembly is constructed and arranged to receive actuation in directions substantially perpendicular to the airflow axis and toward the airflow axis.

24. An electronic system as in claim 20, further comprising:

an electromagnetic interference barrier adjacent the fan;

wherein the electromagnetic interference barrier includes a central screen portion which mirrors the fan profile defined by the fan;

wherein the central screen portion defines a metallic web that concurrently operates as (i) an electromagnetic interference shield which shields against electromagnetic interference and (ii) an air pathway which permits air to flow therethrough;

wherein the attachment assembly includes a frame body disposed adjacent the central screen portion of the electromagnetic interference shield, the frame body mirroring the fan profile and being constructed and arranged to hold the electromagnetic interference shield in a fixed position relative to the fan; and wherein the electromagnetic interference barrier further includes peripheral tab portions coupled to the central screen portion and being disposed around a periphery of the frame body, the peripheral tab portions being constructed and arranged to provide an electromagnetic interference seal between the central screen portion and the chassis when the fan device attaches to the chassis within the air duct defined by the chassis.

\* \* \* \* \*